(12) United States Patent
Hebiguchi et al.

(10) Patent No.: US 11,215,645 B2
(45) Date of Patent: Jan. 4, 2022

(54) CURRENT SENSOR

(71) Applicant: ALPS ALPINE CO., LTD., Tokyo (JP)

(72) Inventors: Hiroyuki Hebiguchi, Miyagi-ken (JP); Manabu Tamura, Tokyo (JP)

(73) Assignee: ALPS ALPINECO., LTD., Tokyo (JP)

( * ) Notice: Subject to any disclaimer, the term of this patent is extended or adjusted under 35 U.S.C. 154(b) by 76 days.

(21) Appl. No.: 16/592,827

(22) Filed: Oct. 4, 2019

(65) Prior Publication Data

US 2020/0033383 A1 Jan. 30, 2020

Related U.S. Application Data

(63) Continuation of application No. PCT/JP2018/014310, filed on Apr. 3, 2018.

(30) Foreign Application Priority Data

Apr. 11, 2017 (JP) .............................. JP2017-078495

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01); *G01R 15/205* (2013.01)

(58) Field of Classification Search
CPC ............... G01R 15/207; G01R 19/0092; G01R 15/205; G01R 15/20
See application file for complete search history.

(56) References Cited

U.S. PATENT DOCUMENTS

| | | | |
|---|---|---|---|
| 9,417,269 B2 | 8/2016 | Sakai et al. | |
| 9,465,054 B2 | 10/2016 | Sakamoto et al. | |
| 2015/0260762 A1* | 9/2015 | Sakamoto | G01R 1/18 |
| | | | 324/117 R |
| 2019/0212372 A1* | 7/2019 | Bilbao De Mendizabal | ............... |
| | | | G01R 19/0092 |
| 2019/0277890 A1* | 9/2019 | Esaka | G01R 15/20 |
| 2019/0293733 A1* | 9/2019 | Esaka | G01R 19/25 |

FOREIGN PATENT DOCUMENTS

| | | | |
|---|---|---|---|
| EP | 3176590 | 6/2017 | |
| JP | 2017227617 A * | 6/2016 | ............. G01R 15/20 |

* cited by examiner

*Primary Examiner* — Akm Zakaria
(74) *Attorney, Agent, or Firm* — Hunton Andrews Kurth LLP

(57) ABSTRACT

A current sensor has two magnetic shields, a target current path, an adjacent current path, and a magneto-electric conversion element. The target current path includes a target partial current path positioned in a spacing. The adjacent current path includes an adjacent partial current path separated from the target partial current path at least in a first direction. Each magnetic shield includes a near end positioned on the same side as the adjacent partial current path in the first direction. In the first direction, the magneto-electric conversion element is positioned between the near end and the center position of the magnetic shield in the first direction.

7 Claims, 9 Drawing Sheets

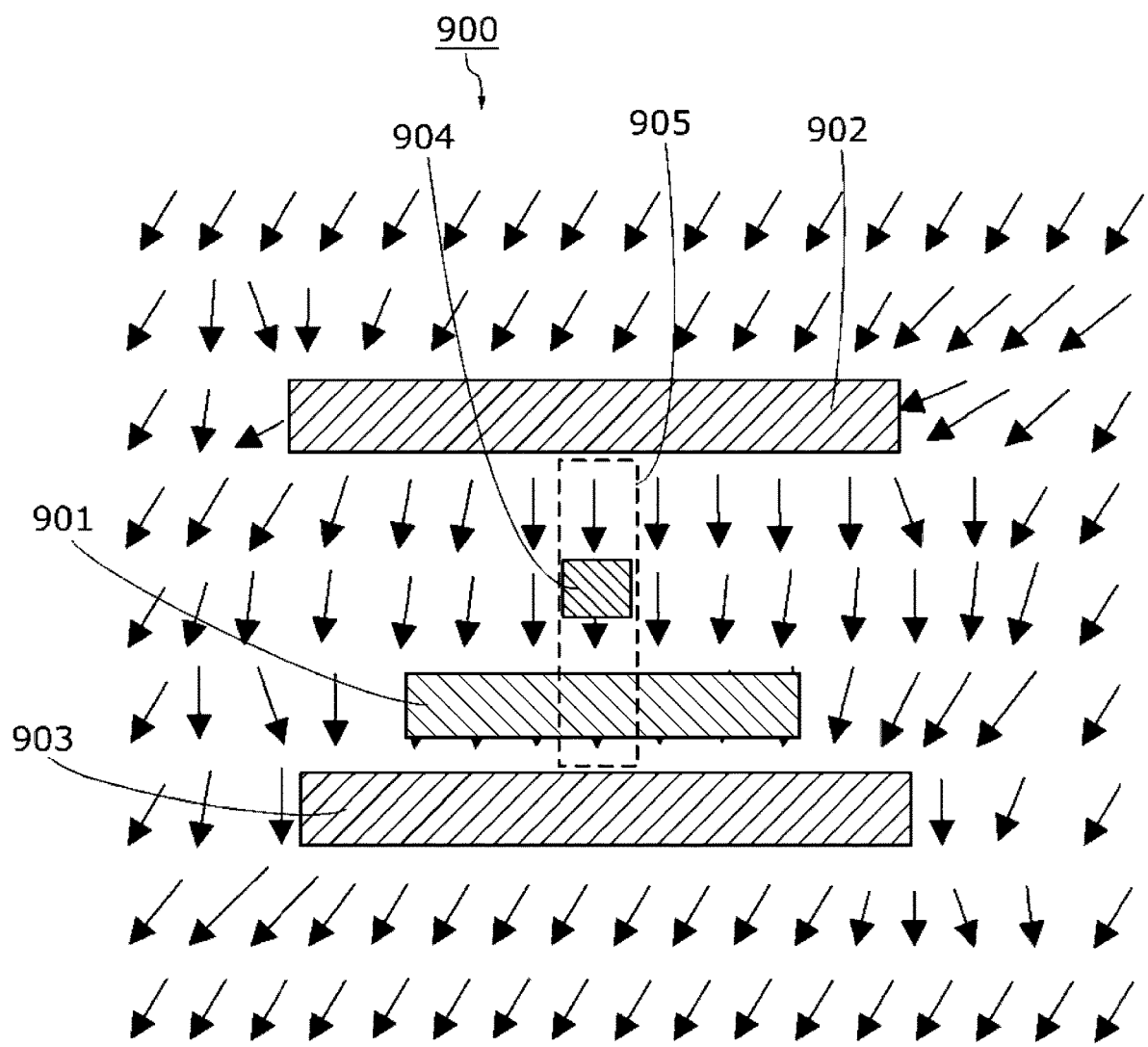

CURRENT SENSOR

CLAIM OF PRIORITY

This application is a Continuation of International Application No. PCT/JP2018/014310 filed on Apr. 3, 2018, which claims benefit of Japanese Patent Application No. 2017-078495 filed on Apr. 11, 2017. The entire contents of each application noted above is incorporated herein by reference.

BACKGROUND OF THE INVENTION

1. Field of the Invention

The present invention relates to a current sensor.

2. Description of the Related Art

A conventional current sensor 900 in which a current path 901 is interposed between two parallel shields 902 and 903 as indicated in FIG. 9 is known. In FIG. 9, each arrow indicates an orientation of a magnetic field. A uniform external magnetic field such as geomagnetism is oriented in a direction in which the magnetic field is shortest between the shield 902 and the shield 903. Due to the influence of the external magnetic field, however, the magnetic field between the shield 902 and the shield 903 is curved in the vicinity of their ends in the horizontal direction in FIG. 9. In the vicinity of a central portion 905 between the shield 902 and the shield 903 in the horizontal direction, however, the orientation of the external magnetic field is in a direction orthogonal to an induced magnetic field of a current path 901. Therefore, a magneto-electric conversion element 904 is placed on a line that connects, in the vertical direction in FIG. 9, from the center of the shield 902 in the horizontal direction in FIG. 9 to the center of the shield 903 in the horizontal direction in FIG. 9. If the widths of the shield 902 and shield 903 in the horizontal direction are small, the orientation of the external magnetic field may not orthogonal to the induced magnetic field of the current path 901 even in the vicinity of the central portion 905 in the horizontal direction. Usually, however, orientations of an external magnetic field cannot be identified during manufacturing. Even if orientations of an external magnetic field cannot be identified, in the vicinity of the central portion 905 in the horizontal direction, it is possible to prevent the external magnetic field from becoming extremely large. Therefore, even if the widths of the shield 902 and shield 903 are short, the magneto-electric conversion element 904 is placed on a line that connects between the center of the shield 902 and the center of the shield 903.

An example of related art is described in Japanese Unexamined Patent Application Publication No. 2016-1168.

SUMMARY OF THE INVENTION

In practice, however, if an adjacent current path is present, a magnetic field outside two magnetic shields is curved. Therefore, unless the sizes of the magnetic shields are extremely large, a magnetic field component in the horizontal direction is present even on a line that connects the centers of the magnetic shield. Accordingly, the placement described in Japanese Unexamined Patent Application Publication No. 2016-1168 is disadvantageous in that each magneto-electric conversion element is likely to undergo the influence of the adjacent current path.

The present invention addresses the situation described above by providing a current sensor that can highly precisely measure a magnetic field generated from a target current path under measurement with the influence of adjacent current paths suppressed.

The present invention has: two magnetic shields; a target current path including a target partial current path positioned in a spacing between the two magnetic shields; an adjacent current path positioned outside the spacing; and a magneto-electric conversion element that detects, in the spacing, a magnetic field generated by a current flowing in the target current path. The adjacent current path includes an adjacent partial current path separated from the target partial current path at least in a first direction. Each of the two magnetic shields includes a near end positioned on the same side as the adjacent partial current path in the first direction. In the first direction, the magneto-electric conversion element is positioned between the near end and the center position of the magnetic shield in the first direction.

According to this structure, it is possible to suppress the influence of the adjacent current path and can highly precisely measure a magnetic field generated from the target current path under measurement.

Preferably, in the current sensor in the present invention, the target partial current path and adjacent partial current path cause a current to flow in a second direction substantially orthogonal to the first direction; the two magnetic shields, target partial current path, and magneto-electric conversion element are at positions at which they at least partially overlap one another in a third direction substantially orthogonal to the first direction and second direction; the positions of two near ends in the first direction are substantially the same.

According to this structure, the magnetic field under measurement is oriented substantially in the third direction in the vicinity of the magneto-electric conversion element, so a signal-to-noise (S/N) ratio is improved.

Preferably, in the current sensor in the present invention, the magneto-electric conversion element is at a position in the first direction at which the first-direction component of an external magnetic field coming from other than the target current path takes a minimum value.

According to this structure, it is possible to suppress the influence of the adjacent current path to a minimum.

Preferably, in the current sensor in the present invention, the width of the magnetic shield in the first direction is represented as W; the distance between portions of the two magnetic shields in the third direction substantially orthogonal to the first direction and second direction, the portions being most distant from each other, is represented as G; the interval between the target partial current path and the adjacent partial current path in the first direction is represented as D; the distance from the center position of the magnetic shield in the first direction to the center position of the magneto-electric conversion element in the first direction is represented as x; when the positive direction of the distance x is directed from the center position of the magnetic shield toward its near end, the magneto-electric conversion element is positioned in a range in which equation (1) holds.

$$0.96\sqrt{\frac{G^2}{G^2+4D^2}} \times W \leq x \leq 5.3\sqrt{\frac{G^2}{G^2+4D^2}} \times W \qquad (1)$$

According to this structure, it is demonstrated by simulations that when the magnitude of a current flowing in the target current path and the magnitude of a current flowing in the adjacent current path are substantially the same, error due to the adjacent partial current path can be suppressed to 0.1% or less.

Preferably, in the current sensor in the present invention, the width of the magnetic shield in the first direction is represented as W; the distance between portions of the two magnetic shields in the third direction substantially orthogonal to the first direction and second direction, the portions being most distant from each other, is represented as G; the interval between the target partial current path and the adjacent partial current path in the first direction is represented as D; the distance from the center position of the magnetic shield in the first direction to the center position of the magneto-electric conversion element in the first direction is represented as x; when the positive direction of the distance x is directed from the center position of the magnetic shield toward its near end, the magneto-electric conversion element is positioned in a range in which equation (2) holds.

$$3.6\sqrt{\frac{G^2}{G^2+4D^2}} \times W \le x \le 3.9\sqrt{\frac{G^2}{G^2+4D^2}} \times W \quad (2)$$

According to this structure, it is demonstrated by simulations that when the magnitude of a current flowing in the target current path and the magnitude of a current flowing in the adjacent current path are substantially the same, error due to the adjacent partial current path can be suppressed to 0.05% or less.

Preferably, in the current sensor in the present invention, the magneto-electric conversion element is positioned in a range in which equation (3) holds.

$$x < \frac{W}{2} \quad (3)$$

According to this structure, the magneto-electric conversion element is positioned within the spacing between the two magnetic shields, the influence of the external magnetic field can be efficiently suppressed by the two magnetic shields.

Preferably, in the current sensor in the present invention, the target partial current path and adjacent partial current path are aligned in the first direction, the whole of the target partial current path is positioned between the two magnetic shields in the third direction, the target partial current path has two sides substantially orthogonal to the first direction and two surfaces substantially orthogonal to the third direction, the width between the two sides of the target partial current path in the first direction is larger than the thickness between the two surfaces of the target partial current path in the third direction, the adjacent partial current path has two adjacent sides substantially orthogonal to the first direction and two adjacent surfaces substantially orthogonal to the third direction, the width between the two adjacent sides of the adjacent partial current path in the first direction is larger than the thickness between the two adjacent surfaces of the adjacent partial current path in the third direction, and each of the two magnetic shields is a plate-like member that expands along a plane substantially orthogonal to the third direction.

According to this structure, the first-direction component of the magnetic field generated in the spacing by the adjacent current path is minimized at the position of the magneto-electric conversion element, so the influence of the adjacent current path can be efficiently suppressed.

Preferably, in the current sensor in the present invention, the width of the target partial current path in the first direction and the width of each magnetic shield in the first direction are substantially the same, and the whole of the target partial current path and the whole of the two magnetic shields are at positions at which they overlay each other in the third direction.

According to this structure, since the whole of the target partial current path overlay the two magnetic shields in the third direction, the electric resistance of the target current path is small.

Preferably, in the current sensor in the present invention, the width of the target partial current path in the first direction is smaller than the width of each of the two magnetic shields in the first direction, and the center of the target partial current path in the first direction and the center of the magneto-electric conversion element in the first direction are at positions at which these centers overlay each other in the third direction.

According to this structure, the first-direction component of a magnetic field generated in the vicinity of the magneto-electric conversion element by the target current path is maximized. The narrower the width of the target current path in the first direction is, the more the orientation of the magnetic field changes according to a deviation between the center of the target partial current path in the first direction and the center of the magneto-electric conversion element in the first direction.

Therefore, particularly when a rated current flowing in the target current path is small and the width of the target current path in the first direction is narrow, this structure is effective.

According to the present invention, it is possible to provide a current sensor that suppresses the influence of an adjacent current path and can highly precisely measure a magnetic field generated from a current path under measurement.

BRIEF DESCRIPTION OF THE DRAWINGS

FIG. 9 is a cross-sectional view of a current sensor in the prior art.

DESCRIPTION OF THE PREFERRED EMBODIMENTS

First Embodiment

Figure 1:
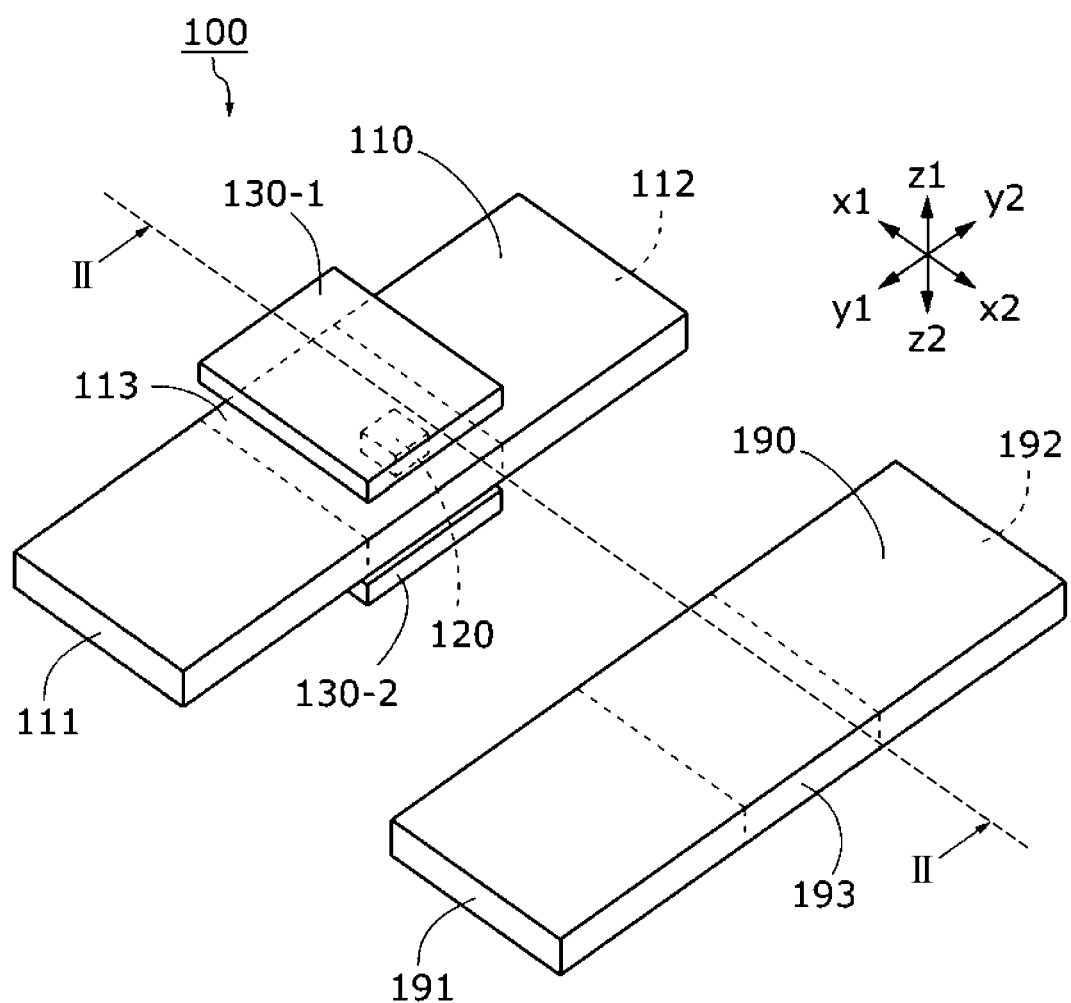
FIG. 1 is a perspective view of a current sensor in a first embodiment of the present invention.

A current sensor according to a first embodiment of the present invention will be described below. FIG. 1 is a perspective view of a current sensor 100 in this embodiment of the present invention. The current sensor 100 includes a target current path 110 targeted for current measurement, a magneto-electric conversion element 120 that measures a current flowing in the a target current path 110 by detecting an induced magnetic field generated from the target current path 110, a first magnetic shield 130-1 that shapes a magnetic field around the target current path 110, a second magnetic shield 130-2 that also shapes the magnetic field around the target current path 110, and an adjacent current path 190, which is not targeted for current measurement. In another example, the adjacent current path 190 may be targeted for current measurement by another magneto-electric conversion element.

In this specification, an x direction (also referred to as a first direction or horizontal direction), a y direction (also referred to as a second direction or current direction), and a z direction (also referred to as a third direction or height direction), which are mutually orthogonal, will be stipulated. The x direction is represented without distinguishing between an x1 direction and an x2 direction, which are mutually opposite. The y direction is represented without distinguishing between a y1 direction and y2 direction, which are mutually opposite. The z direction is represented without distinguishing between a z1 direction and z2 direction, which are mutually opposite. An x1 side will sometimes be represented as left, and an x2 side will sometimes be represented as right. These directions are stipulated for the sake of convenience to explain relative positional relationships, and do not restrict directions during actual usage. The shapes of the constituent elements are not limited to strict geometrical shapes based on described representations regardless of whether "substantially" is described as long as the technical concept of the embodiments disclosed in this specification is implemented.

Target Current Path

The target current path 110, which is made of a metal, is a substantially rectangular parallelepiped enclosed by two planes substantially parallel to an xy plane, two planes substantially parallel to a yz plane, and two planes substantially parallel to a zx plane. In the target current path 110, the width in the x direction is smaller than the length in the y direction. In the target current path 110, the thickness in the z direction is smaller than the width in the x direction.

A surface of the target current path 110 on the y1 side will be referred to as a first end 111. A surface of the target current path 110 on the y2 side will be referred to as a second end 112. The target current path 110 is electrically connected to an external circuit and causes a current to flow in the y direction between the first end 111 and the second end 112. A partial segment of the target current path 110 in the y direction between the first end 111 and the second end 112 will be referred to as a target partial current path 113.

Figure 2:
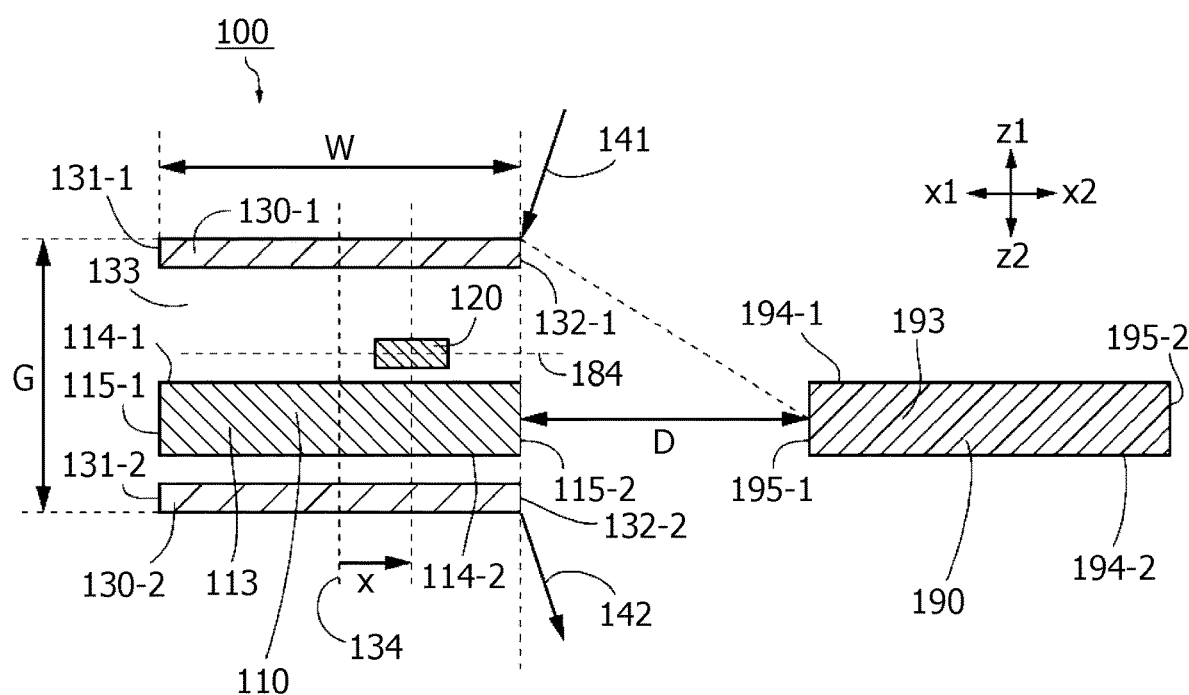
FIG. 2 is a cross-sectional view of the current sensor as taken along line II-II in FIG. 1.

FIG. 2 is a cross-sectional view of the current sensor 100 as taken along line II-II in FIG. 1, the cross-section being substantially parallel to the zx plane. As illustrated in FIG. 2, the target partial current path 113 may include a first surface 114-1, on the z1 side, substantially parallel to the xy plane and a second surface 114-2, on the z2 side, substantially parallel to the xy plane (sometimes referred to below as the surfaces 114 without being distinguished). The target partial current path 113 may also include a first side 115-1, on the x1 side, substantially parallel to the yz plane and a second side 115-2, on the x2 side, substantially parallel to the yz plane (sometimes referred to below as the sides 115 without being distinguished).

Adjacent Current Path

The adjacent current path 190 is made of a metal. As illustrated in FIG. 1, the shape of the adjacent current path 190 is substantially the same as the shape of the target current path 110. The adjacent current path 190 is disposed so as to be in parallel to the target current path 110 in the x2 direction. A surface of the adjacent current path 190 on the y1 side will be referred to as a first adjacent end 191. A surface of the adjacent current path 190 on the y2 side will be referred to as a second adjacent end 192. The adjacent current path 190 is electrically connected to an external circuit and causes a current to flow in the y direction between the first adjacent end 191 and the second adjacent end 192.

A partial segment of the adjacent current path 190 in the y direction between the first adjacent end 191 and the second adjacent end 192 will be referred to as an adjacent partial current path 193. The shape of the adjacent partial current path 193 is substantially the same as the shape of the target partial current path 113. The adjacent partial current path 193 is disposed so as to be in parallel to the target partial current path 113 in the x2 direction. The target partial current path 113 and adjacent partial current path 193 are aligned in the x direction and are separated from each other in the x direction.

As illustrated in FIG. 2, the adjacent partial current path 193 may include a first adjacent surface 194-1, on the z1 side, substantially parallel to the xy plane and a second adjacent surface 194-2, on the z2 side, substantially parallel to the xy plane (sometimes referred to below as the adjacent surfaces 194 without being distinguished). The adjacent partial current path 193 may also include a first adjacent side 195-1, on the x1 side, substantially parallel to the yz plane and a second adjacent side 195-2, on the x2 side, substantially parallel to the yz plane (sometimes referred to below as the sides 195 without being distinguished).

Magneto-Electric Conversion Element

The magneto-electric conversion element 120 illustrated in FIG. 2 is formed from, for example, a magnetoresistance effect element or a Hall effect element. The magneto-electric conversion element 120 is disposed opposite to the target partial current path 113 on the z1 side of the target partial current path 113. The magneto-electric conversion element 120 can detect the x-direction component of a magnetic field.

Magnetic Shields

As illustrated in FIG. 1, each magnetic shield 130, which is formed from a magnetic material, is a substantially rectangular parallelepiped enclosed by two planes substantially parallel to the xy plane, two planes substantially parallel to the yz plane, and two planes substantially parallel to the zx plane. Each magnetic shield 130 may be a plate-like member that expands substantially in parallel to the xy plane. In each magnetic shield 130, the thickness in the z direction is smaller than the length in the y direction, and the length in the y direction is smaller than the width in the x direction. The second magnetic shield 130-2 is positioned on the z2 side of the first magnetic shield 130-1. As illustrated in FIG. 2, a spacing 133 is formed between the two magnetic shields 130 in the z direction. The shapes of the two magnetic shields 130 are substantially the same. The two magnetic shields 130 are at positions at which they completely overlay each other in the z direction.

The surface of the first magnetic shield 130-1 on the x1 side will be referred to as a first far end 131-1, and the surface of the first magnetic shield 130-1 on the x2 side will be referred to as a first near end 132-1. The surface of the second magnetic shield 130-2 on the x1 side will be referred to as a second far end 131-2, and the surface of the second magnetic shield 130-2 on the x2 side will be referred to as a second near end 132-2. In the x direction, the positions of the first near end 132-1 and second near end 132-2 (sometimes referred to below as the near ends 132 without being distinguished) may be substantially the same.

Positional Relationship

It is preferable for at least part of the target current path 110 to be positioned in the spacing 133 between the two magnetic shields 130 in the z direction. In this embodiment, the whole of the target partial current path 113 may be positioned in the spacing 133. The outer shapes of the two magnetic shields 130 and target partial current path 113 substantially match in the z direction. That is, the width of the target partial current path 113 in the x direction and the width of the magnetic shields 130 in the x direction may be substantially the same. The whole of the adjacent current path 190 is positioned outside the spacing 133.

The magneto-electric conversion element 120 is positioned in the spacing 133. The two magnetic shields 130, target partial current path 113, and magneto-electric conversion element 120 may be at positions at which they at least partially overlap one another in the z direction. The two near ends 132 are positioned on the same side as the adjacent partial current path 193 in the x direction. The center position of the magneto-electric conversion element 120 in the x direction is positioned between the near end 132 and the center position 134 of each magnetic shield 130 in the x direction.

The width of the magnetic shield 130 in the x direction may be represented as W. The distance between portions of the two magnetic shields 130 in the z direction, the portions being most distant from each other, may be represented as G. The interval between the target partial current path 113 and the adjacent partial current path 193 in the x direction may be represented as D. The distance from the center position 134 of the magnetic shield 130 in the x direction to the center position of the magneto-electric conversion element 120 in the x direction may be represented as x. The positive direction of the distance x is directed from the center position 134 of the magnetic shield 130 toward its near end 132.

Position of the Magneto-Electric Conversion Element

In the z direction, the target current path 110 and adjacent current path 190 are at the same position. The magneto-electric conversion element 120 is more on the z1 side than is the center of the two magnetic shields 130 in the z direction. Although described later in detail, an magnetic field generated by the adjacent current path 190 is diagonally incident in the vicinity of the near ends 132 of the magnetic shields 130 as represented by an arrow 141 and an arrow 142.

Figure 3:
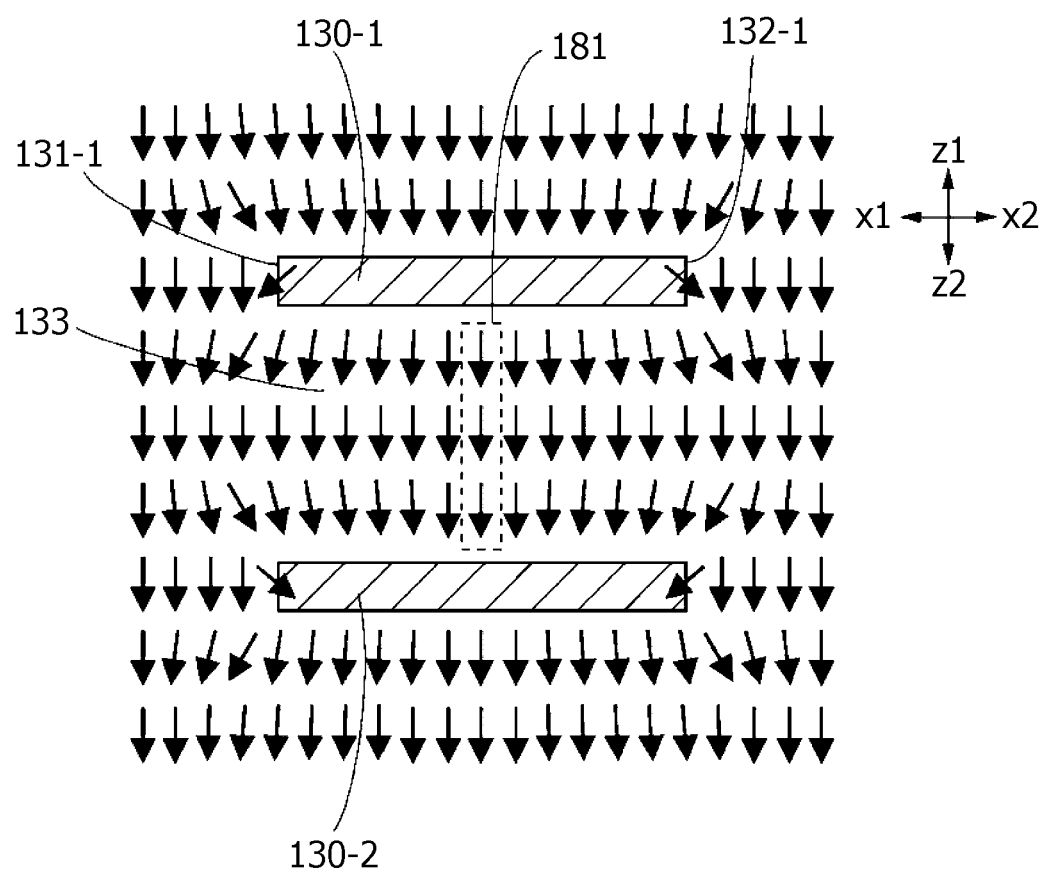
FIG. 3 illustrates a state in which, in the current sensor illustrated in FIG. 2, an external magnetic field in the z2 direction is shaped by two magnetic shields.

FIG. 3 illustrates a state in which an external magnetic field, which is not under measurement, is shaped by the first magnetic shield 130-1 and second magnetic shield 130-2 illustrated in FIG. 2. Each arrow in FIG. 3 indicates the orientation of the magnetic field at a point. In the example in FIG. 3, at a position distant from the two magnetic shields 130, the external magnetic field is oriented substantially in the z2 direction. The external magnetic field is drawn in the vicinity of the two magnetic shields 130 by the two magnetic shields 130.

The magnetic field in the vicinity of the first far end 131-1 has an x2-direction component on the z1 side and an x1-direction component on the z2 side. The magnetic field in the vicinity of the first near end 132-1 has an x1-direction component on the z1 side and an x2-direction component on the z2 side. The magnetic field in the vicinity of the second far end 131-2 has an x2-direction component on the z1 side and an x1-direction component on the z2 side. The magnetic field in the vicinity of the second near end 132-2 has an x1-direction component on the z1 side and an x2-direction component on the z2 side. As a result, in a half of the spacing 133 on the x1 side, the magnetic flux expands in the x1 direction and, in a half of the spacing 133 on the x2 side, extends in the x2 direction.

In a first area 181 located in the vicinity of the center in the spacing 133 in the x direction, the x-direction components of the magnetic field are essentially zero. Conventionally, a general solution to suppressing the influence of the external magnetic field has been to place the magneto-electric conversion element 120, which detects the x-direction components of a magnetic field generated from the target current path 110 (FIG. 2), in the first area 181 according to the model in FIG. 3.

Figure 4:
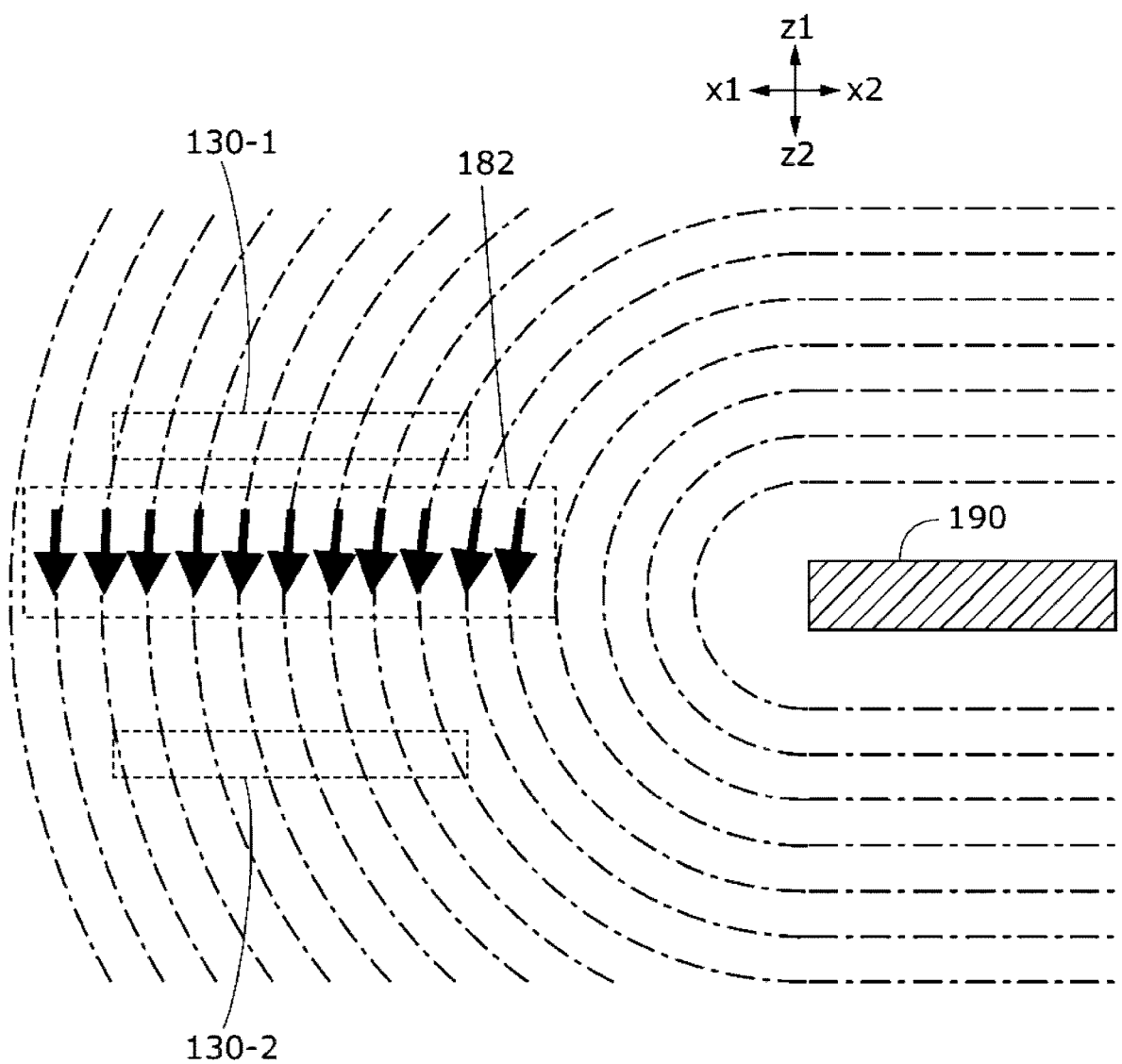
FIG. 4 is illustrates an external magnetic field generated by a current flowing in an adjacent current path in the current sensor illustrated in FIG. 2.

FIG. 4 illustrates an external magnetic field generated by a current flowing in the adjacent current path 190. In the example in FIG. 4, the positions of the two magnetic shields 130 are indicated by dotted lines. In practice, however, the two magnetic shields 130 are not present. In the z direction, the adjacent current path 190 is positioned at the center between the two magnetic shields 130.

Magnetic flux lines indicated by dash-dot lines are formed around the adjacent current path 190. A second area 182 passing through the spacing 133 and extending in the x direction is present more on the z1 side than is the adjacent current path 190. In the second area 182, the x-direction components of the magnetic field are present to the extent that they cannot be ignored.

Figure 5:
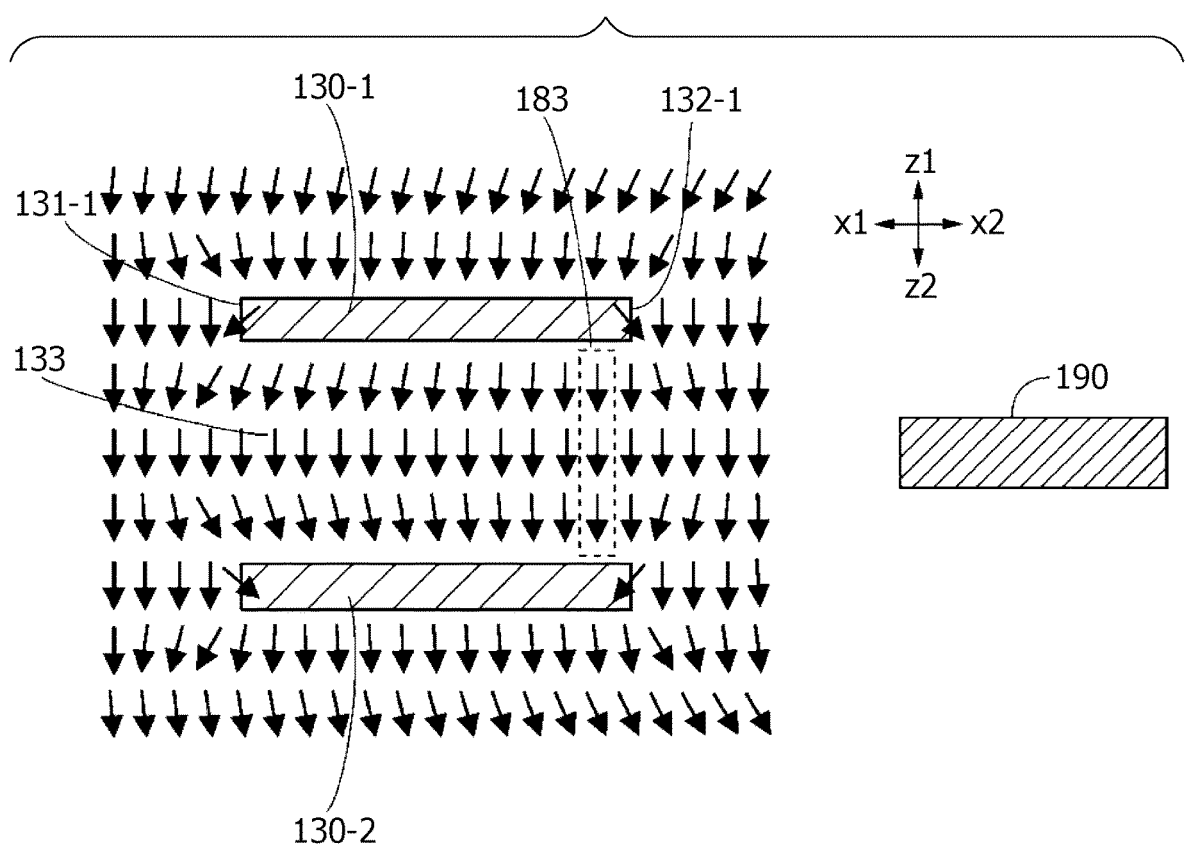
FIG. 5 illustrates a combined external magnetic field in which the external magnetic field illustrated in FIG. 3 and the external magnetic field indicted in FIG. 4 are combined together.

FIG. 5 illustrates a combined external magnetic field in which the external magnetic field, in the z2-direction, illustrated in FIG. 3 and the external magnetic field, generated by the adjacent current path 190, indicted in FIG. 4 are combined together. Each arrow in FIG. 5 indicates the orientation of the magnetic field at a point at a certain moment. In a half of the spacing 133 on the z1 side, the x1-direction component due to the influence of the adjacent current path 190 is combined with the external magnetic field in the z2 direction. In a half of the spacing 133 on the z2 side, the x2-direction component due to the influence of the adjacent current path 190 is combined with the external magnetic field in the z2 direction. As a result, a third area 183 in which the x-direction components of the magnetic field become essentially zero in the spacing 133 is located at a position apart from the first area 181 in FIG. 3 toward the x2 side. That is, the third area 183 illustrated in FIG. 5 is located between the near ends 132 and the center of the magnetic shields 130 in the x direction.

Simulation Results

Figure 6:
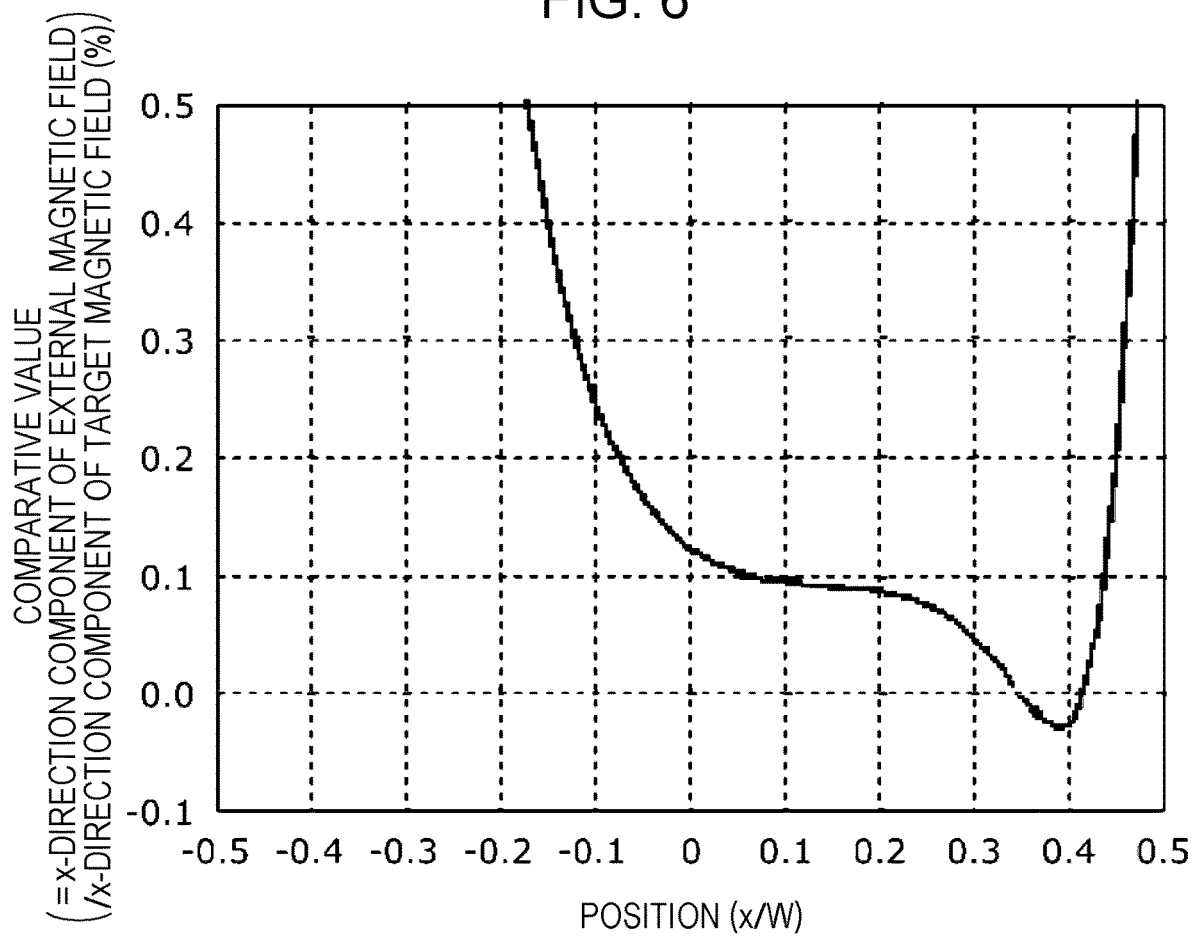
FIG. 6 is a graph that represents a relationship between a comparative value and the position of a magneto-electric conversion element in the current sensor illustrated in FIG. 2.

FIG. 6 is a graph that represents a relationship between a comparative value and the position, in the x direction, of the magneto-electric conversion element 120 on a plane 184 in FIG. 2. The comparative value is a value obtained by dividing the x-direction component of an external magnetic field coming from other than the target partial current path 113 by the x-direction component of a magnetic field due to the target partial current path 113. FIG. 6 is a simulation result taken as an example. Similar simulation results were obtained for various parameters.

The plane 184 illustrated in FIG. 2 is in parallel to the xy plane. In FIG. 6, the horizontal axis represents the position of the magneto-electric conversion element 120 as x/W. The vertical axis represents the comparative value (also referred to as error) obtained by dividing the x-direction component of the external magnetic field by the x-direction component of the target magnetic field (that is, the magnetic field generated from the target current path 110) as percentage (%).

As illustrated in FIG. 6, the comparative value is minimized near position 0.4. When the value of the position is increased from the value at the position at which the comparative value is minimized, the comparative value is increased. When the value of the position is decreased from the value at the position at which the minimum value is taken, the comparative value is increased. The closer the comparative value is to 0, the more accurately the magnetic field from the target current path 110 can be detected. As for the position in the x direction, it is preferable for the magneto-electric conversion element 120 to be positioned in a range in which the comparative value is 0.1 or less, that is, in a range in which equation (1) holds. From a plurality of simulations in which different parameters were used, equation (1) was derived as a general range in which the comparative value becomes 0.1 or less.

$$0.96\sqrt{\frac{G^2}{G^2+4D^2}} \times W \le x \le 5.3\sqrt{\frac{G^2}{G^2+4D^2}} \times W \quad (1)$$

More preferably, as for the position in the x direction, it is preferably for the magneto-electric conversion element 120 to be positioned in a range in which the comparative value is 0.05 or less, that is, in a range in which equation (2) holds. From a plurality of simulations in which different parameters were used, equation (2) was derived as a general range in which the comparative value becomes 0.05 or less.

$$3.6\sqrt{\frac{G^2}{G^2+4D^2}} \times W \le x \le 3.9\sqrt{\frac{G^2}{G^2+4D^2}} \times W \quad (2)$$

More preferably, as for the position in the x direction, it is preferably for the magneto-electric conversion element 120 to be positioned in a range in which the comparative value is minimized.

When the comparative value is minimized within a range of more than position 0 to less than position 0.5, it is preferable for the magneto-electric conversion element 120 be positioned in a range in which equation (3) holds.

$$x < \frac{W}{2} \quad (3)$$

As illustrated in FIG. 5, the magnetic field has substantially only a z-direction component at the center between the two magnetic shields 130 in the z direction. Since the target current path 110 (FIG. 2) has a certain degree of thickness in the z direction, however, the magneto-electric conversion element 120 may fail to be placed at the central portion between the two magnetic shields 130. In this case, this embodiment is effective.

It is preferable for the adjacent partial current path 193 illustrated in FIG. 2 to be separated from the target partial current path 113 at least in the x direction. In another example, the adjacent partial current path 193 may be separated from the target partial current path 113 both in the x direction and in the z direction. In another example, the two magnetic shields 130, target partial current path 113, and magneto-electric conversion element 120 may have a positional relationship different from the one illustrated in FIG. 2. It is preferable for the two magnetic shields 130, target partial current path 113, and magneto-electric conversion element 120 to be at positions at which they at least partially overlap one another in the z direction.

Conclusion

The current sensor 100 in this embodiment has: two magnetic shields 130; a target current path 110 including a target partial current path 113 positioned in a spacing 133 between the two magnetic shields 130; an adjacent current path 190 positioned outside the spacing 133; and a magneto-electric conversion element 120 that detects, in the spacing 133, a magnetic field generated by a current flowing in the target current path 110. The adjacent current path 190 includes an adjacent partial current path 193 separated from the target partial current path 113 at least in a first direction. Each magnetic shield 130 includes a near end 132 positioned on the same side as the adjacent partial current path 193 in the first direction. In the first direction, the magneto-electric conversion element 120 is positioned between the near end 132 and the center position 134 of the magnetic shield 130 in the first direction.

According to this embodiment, it is possible to suppress the influence of the adjacent current path 190 and can highly precisely measure a magnetic field generated from the target current path 110 under measurement.

In this embodiment, the target partial current path 113 and adjacent partial current path 193 may cause a current to flow in the second direction substantially orthogonal to the first direction; the two magnetic shields 130, target partial current path 113, and magneto-electric conversion element 120 may be at positions at which they at least partially overlap one another in the third direction substantially orthogonal to the first direction and second direction; the positions of two near ends 132 in the first direction may be substantially the same.

According to this embodiment, it is possible to suppress the influence of the adjacent current path 190 by placing a magnetic field in the vicinity of the magneto-electric conversion element 120, the magnetic field being in the spacing 133, more on the third-direction side.

In this embodiment, the magneto-electric conversion element 120 may be at a position in the first direction at which the first-direction component of an external magnetic field coming from other than the target current path 110 takes a minimum value.

According to this embodiment, it is possible to suppress the influence of the adjacent current path 190 to a minimum.

In this embodiment, the width of the magnetic shield 130 in the first direction may be represented as W; the distance between portions of the two magnetic shields 130 in the third direction, the portions being most distant from each other, may be represented as G; the interval between the target partial current path 113 and the adjacent partial current path 193 in the first direction may be represented as D; the distance from the center position 134 of the magnetic shield 130 in the first direction to the center position of the magneto-electric conversion element 120 in the first direction may be represented as x; when the positive direction of the distance x is directed from the center position 134 of the magnetic shield 130 toward its near end 132, the magneto-electric conversion element 120 may be positioned in a range in which equation (1) holds.

According to this embodiment, it is demonstrated by simulations that when the magnitude of a current flowing in the target current path 110 and the magnitude of a current flowing in the adjacent current path 190 are substantially the same, the comparative value can be suppressed to 0.1% or less.

In this embodiment, the width of the magnetic shield 130 in the first direction may be represented as W; the distance between portions of the two magnetic shields 130 in the third direction, the portions being most distant from each other, may be represented as G; the interval between the target partial current path 113 and the adjacent partial current path 193 in the first direction may be represented as D; the distance from the center position 134 of the magnetic shield 130 in the first direction to the center position of the magneto-electric conversion element 120 in the first direction may be represented as x, when the positive direction of the distance x is directed from the center position 134 of the magnetic shield 130 toward its near end 132, the magneto-electric conversion element 120 may be positioned in a range in which equation (2) holds.

According to this embodiment, it is demonstrated by simulations that when the magnitude of a current flowing in the target current path 110 and the magnitude of a current flowing in the adjacent current path 190 are substantially the same, the comparative value can be suppressed to 0.05% or less.

In this embodiment, the magneto-electric conversion element 120 may be positioned in a range in which equation (3) holds.

According to this embodiment, since the magneto-electric conversion element 120 is positioned within the spacing 133 between the two magnetic shields 130, the influence of the external magnetic field can be efficiently suppressed by the two magnetic shields 130.

In this embodiment, the target partial current path 113 and adjacent partial current path 193 may be aligned in the first direction, the whole of the target partial current path 113 may be positioned between the two magnetic shields 130 in the third direction, the target partial current path 113 may have two sides 115 substantially orthogonal to the first direction and two surfaces 114 substantially orthogonal to the third direction, the width between the two sides 115 of the target partial current path 113 in the first direction may be larger than the thickness between the two surfaces 114 of the target partial current path 113 in the third direction, the adjacent partial current path 193 may have two adjacent sides 195 substantially orthogonal to the first direction and two adjacent surfaces 194 substantially orthogonal to the third direction, the width between the two adjacent sides 195 of the adjacent partial current path 193 in the first direction may be larger than the thickness between the two adjacent surfaces 194 of the adjacent partial current path 193 in the third direction, and each of the two magnetic shields 130 may be a plate-like member that expands along a plane substantially orthogonal to the third direction.

According to this embodiment, the first-direction component of the magnetic field generated in the spacing 133 by the adjacent current path 190 is minimized at the position of the magneto-electric conversion element 120, so the influence of the adjacent current path 190 can be efficiently suppressed.

In this embodiment, the width of the target partial current path 113 in the first direction and the width of each magnetic shield 130 in the first direction may be substantially the same, and the whole of the target partial current path 113 and the whole of the two magnetic shields 130 may be at positions at which they overlay each other in the third direction.

According to this embodiment, since the whole of the target partial current path 113 overlay the two magnetic shields 130 in the third direction, the electric resistance of the target current path 110 is small.

Variation

Figure 7:
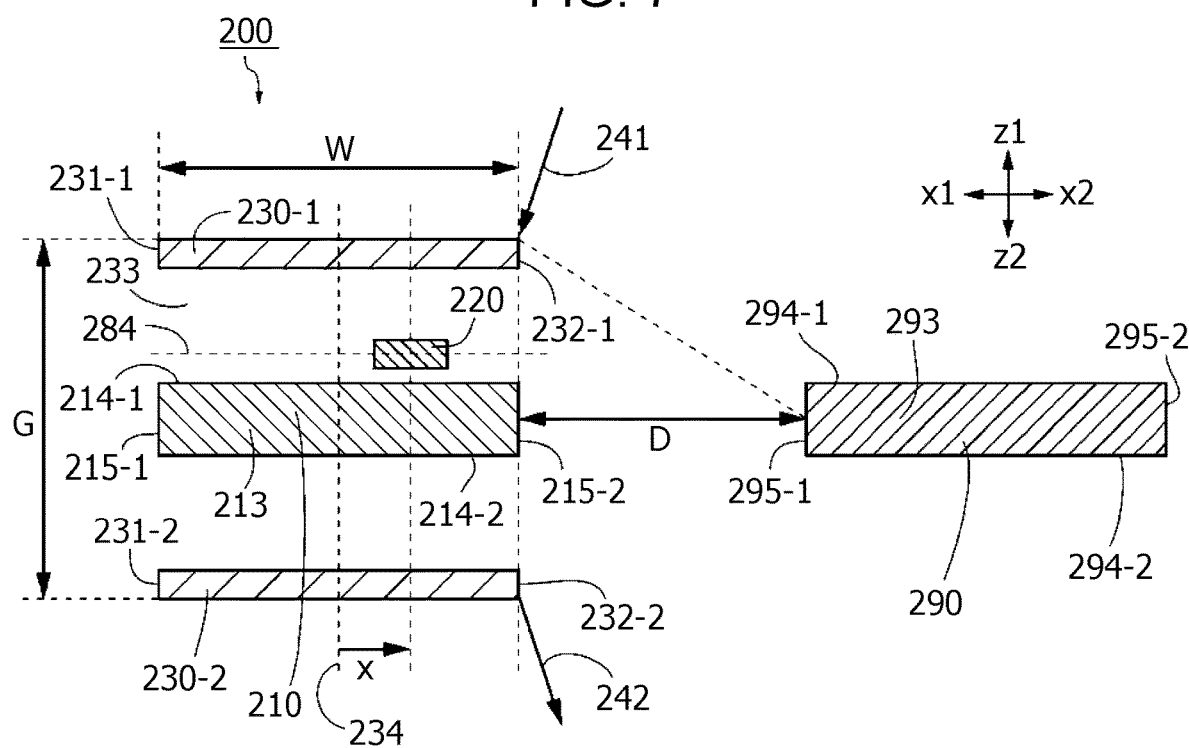
FIG. 7 is a cross-sectional view of a current sensor in a variation of the first embodiment.

FIG. 7 is a cross-sectional view of a current sensor 200 in a variation of the current sensor 100 (FIG. 2) in the first embodiment. The current sensor 200 illustrated in FIG. 7 and the current sensor 100 illustrated in FIG. 2 have similar structures with some exceptions. For the current sensor 100 illustrated in FIG. 2, the hundred's digit of the reference numeral of each constituent element is 1. For the current sensor 200 illustrated in FIG. 7, the hundred's digit of the reference numeral of each constituent element is 2. Unless otherwise noted, constituent elements that differ only in the hundred's digit are similar to each other. The values of the width W, distance G, interval D, and distance x, which are parameters, are not always the same between the current sensor 200 illustrated in FIG. 7 and the current sensor 100 illustrated in FIG. 2.

In the z direction, a target current path 210 is positioned at a central portion between two magnetic shields 230. In the z direction, the target current path 210 and an adjacent current path 290 are at the same position. A magneto-electric conversion element 220 is more on the z1 side than is the center of the two magnetic shields 230 in the z direction. In the z direction, the adjacent current path 290 is positioned at the center between the two magnetic shields 230.

Descriptions of the position of the magneto-electric conversion element 120 in the first embodiment that have been given with reference to FIGS. 2 to 6 are also applied to the position of the magneto-electric conversion element 220 in the current sensor 200 illustrated in FIG. 7. The position of the target current path 110, in the current sensor 100 illustrated in FIG. 2, with respect to the two magnetic shields 130 differs from the position of the target current path 210, in the current sensor 200 illustrated in FIG. 7, with respect to the two magnetic shields 230. The effect in the first embodiment is largely affected by the difference between the incidence angle of the magnetic flux that enters the magnetic shield 130 (FIG. 2) and the incidence angle of the magnetic flux that enters the magnetic shield 230 (FIG. 7), but is less likely to be affected by the difference between the position of the target current path 110 (FIG. 2) and the position of the target current path 210 (FIG. 7), so the positional relationship between the target current path 110 (FIG. 2) and the target current path 210 (FIG. 7) is not important.

With the current sensor 200 (FIG. 7) in the variation as well, an effect similar to the effect of the current sensor 100 (FIG. 2) in the first embodiment is obtained.

Second Embodiment

Figure 8:
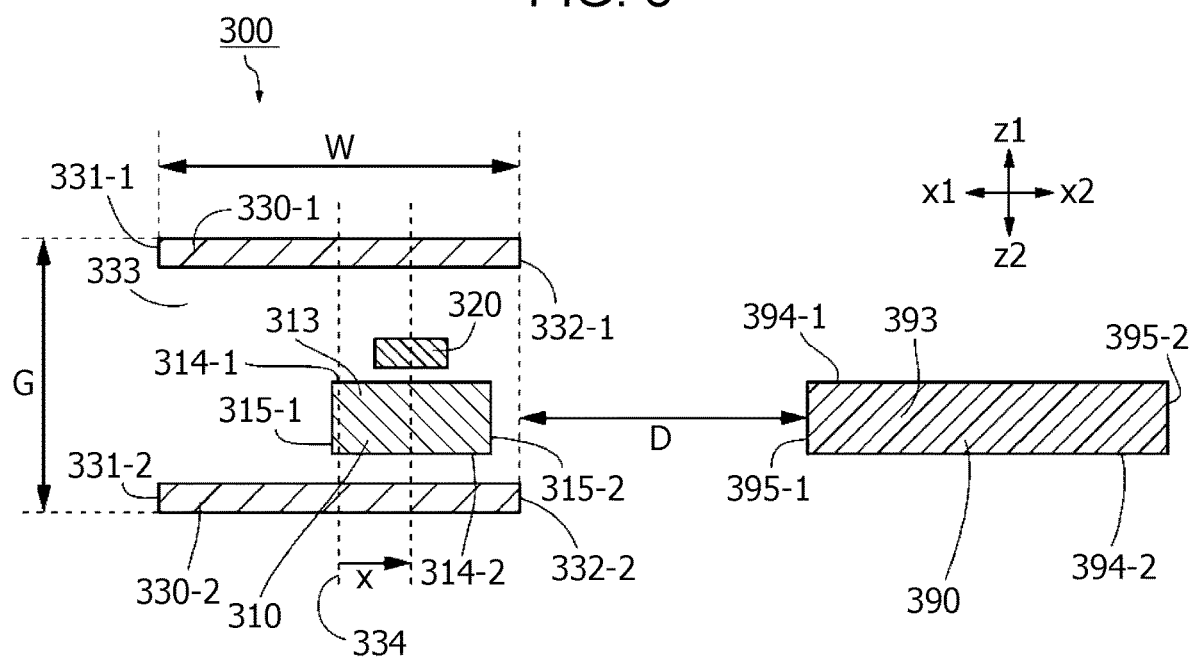
FIG. 8 is a cross-sectional view of a current sensor in a second embodiment of the present invention.

Next, a current sensor 300 in a second embodiment will be described. FIG. 8 is a cross-sectional view of the current sensor 300 in this embodiment at a cross section similar to FIG. 2. Differences between the current sensor 100 (FIG. 2) in the first embodiment and the current sensor 300 in this embodiment will be mainly described below. For the current sensor 100 in the first embodiment illustrated in FIG. 2, the hundred's digit of the reference numeral of each constituent element is 1. For the current sensor 300 in the second embodiment illustrated in FIG. 8, the hundred's digit of the reference numeral of each constituent element is 3. Unless otherwise noted, constituent elements that differ only in the hundred's digit are similar to each other.

The width of a target partial current path 313 in the x direction may be smaller than the width of each of two magnetic shields 330 in the x direction. The center of the target partial current path 313 in the x direction and the center of a magneto-electric conversion element 320 in the x direction may be at positions at which these centers match in the z direction.

Conclusion

In this embodiment, the width of a target partial current path 313 in the first direction may be smaller than the width of each of two magnetic shields 330 in the first direction, and the center of the target partial current path 313 in the first direction and the center of a magneto-electric conversion element 320 in the first direction may be at positions at which these centers match in the third direction.

According to this embodiment, the first-direction component of a magnetic field generated in the vicinity of the magneto-electric conversion element 320 by a target current path 310 is maximized. The narrower the width of the target current path 310 in the first direction is, the more the orientation of the magnetic field changes according to a deviation between the center of the target partial current path 313 in the first direction and the center of the magneto-electric conversion element 320 in the first direction. Therefore, particularly when a rated current flowing in the target current path 310 is small and the width of the target current path 310 in the first direction is narrow, this embodiment is effective.

The present invention is not limited to the embodiments described above. That is, a person having ordinary skill in the art may make various modifications, combinations, sub-combinations, and replacements for the constituent elements in the embodiments described above, without departing from the technical range of the present invention or an equivalent range of the technical range.

The present invention can be applied to various current sensors that measure a magnetic field generated by a current flowing in a current path under measurement in the vicinity of an adjacent current path.

What is claimed is:

1. A current sensor comprising:
two magnetic shields;
a target current path including a target partial current path positioned in a spacing between the two magnetic shields;
an adjacent current path positioned outside the spacing; and
a magneto-electric conversion element that detects, in the spacing, a magnetic field generated by a current flowing in the target current path; wherein
the adjacent current path includes an adjacent partial current path separated from the target partial current path at least in a first direction,
each of the two magnetic shields includes a near end positioned on the same side as the adjacent partial current path in the first direction,
the magneto-electric conversion element is positioned between the near end and a center position of the magnetic shield in the first direction,
the target partial current path and the adjacent partial current path cause a current to flow in a second direction substantially orthogonal to the first direction,
the two magnetic shields, the target partial current path, and the magneto-electric conversion element are at positions at which the two magnetic shields, the target partial current path, and the magneto-electric conversion element at least partially overlap one another in a third direction substantially orthogonal to the first direction and the second direction,
positions of two near ends in the first direction are substantially the same, and
the magneto-electric conversion element is at a position in the first direction at which a first-direction component of an external magnetic field coming from other than the target current path takes a minimum value.

2. The current sensor according to claim 1, wherein:
a width of the magnetic shield in the first direction is represented as W;
a distance between portions of the two magnetic shields in a third direction substantially orthogonal to the first direction and a second direction, the portions being most distant from each other, is represented as G;
an interval between the target partial current path and the adjacent partial current path in the first direction is represented as D;
a distance from the center position of the magnetic shield in the first direction to a center position of the magneto-electric conversion element in the first direction is represented as x; and
when a positive direction of the distance x is directed from the center position of the magnetic shield toward the near end, the magneto-electric conversion element is positioned in a range in which equation (1) holds.

$$0.96\sqrt{\frac{G^2}{G^2+4D^2}} \times W \le x \le 5.3\sqrt{\frac{G^2}{G^2+4D^2}} \times W. \quad (1)$$

3. The current sensor according to claim 1, wherein:
a width of the magnetic shield in the first direction is represented as W;
a distance between portions of the two magnetic shields in a third direction substantially orthogonal to the first direction and the second direction, the portions being most distant from each other, is represented as G;
an interval between the target partial current path and the adjacent partial current path in the first direction is represented as D;
a distance from the center position of the magnetic shield in the first direction to a center position of the magneto-electric conversion element in the first direction is represented as x; and
when a positive direction of the distance x is directed from the center position of the magnetic shield toward the near end, the magneto-electric conversion element is positioned in a range in which equation (2) holds.

$$3.6\sqrt{\frac{G^2}{G^2+4D^2}} \times W \leq x \leq 3.9\sqrt{\frac{G^2}{G^2+4D^2}} \times W. \quad (2)$$

4. The current sensor according to claim 2, wherein the magneto-electric conversion element is positioned in a range in which equation (3) holds.

$$x < \frac{W}{2}. \quad (3)$$

5. The current sensor according to claim 1, wherein:
the target partial current path and the adjacent partial current path are aligned in the first direction;
a whole of the target partial current path is positioned between the two magnetic shields in a third direction;
the target partial current path has two sides substantially orthogonal to the first direction and two surfaces substantially orthogonal to the third direction;
a width between the two sides of the target partial current path in the first direction is larger than a thickness between the two surfaces of the target partial current path in the third direction;
the adjacent partial current path has two adjacent sides substantially orthogonal to the first direction and two adjacent surfaces substantially orthogonal to the third direction;
a width between the two adjacent sides of the adjacent partial current path in the first direction is larger than a thickness between the two adjacent surfaces of the adjacent partial current path in the third direction; and
each of the two magnetic shields is a plate-like member that expands along a plane substantially orthogonal to the third direction.

6. The current sensor according to claim 1, wherein:
a width of the target partial current path in the first direction and a width of each magnetic shield in the first direction are substantially the same; and
a whole of the target partial current path and a whole of the two magnetic shields are at positions at which the whole of the target partial current path and the whole of the two magnetic shields overlay each other in a third direction.

7. The current sensor according to claim 1, wherein:
a width of the target partial current path in the first direction is smaller than a width of each of the two magnetic shields in the first direction; and
a center of the target partial current path in the first direction and a center of the magneto-electric conversion element in the first direction are at positions at which the centers overlay each other in a third direction.

\* \* \* \* \*